(12) United States Patent
Cheng et al.

(10) Patent No.: US 12,176,253 B2
(45) Date of Patent: *Dec. 24, 2024

(54) DEPOSITION SYSTEM AND METHOD

(71) Applicant: Taiwan Semiconductor Manufacturing Co., Ltd., Hsinchu (TW)

(72) Inventors: Wen-Hao Cheng, Hsinchu (TW); Hsuan-Chih Chu, Hsinchu (TW); Yen-Yu Chen, Hsinchu (TW); Yi-Ming Dai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/341,506

(22) Filed: Jun. 26, 2023

(65) Prior Publication Data

US 2023/0352350 A1 Nov. 2, 2023

Related U.S. Application Data

(63) Continuation of application No. 16/994,267, filed on Aug. 14, 2020, now Pat. No. 11,728,226.

(51) Int. Cl.
*H01L 21/66* (2006.01)
*C23C 14/35* (2006.01)
(Continued)

(52) U.S. Cl.
CPC ............ *H01L 22/26* (2013.01); *C23C 14/351* (2013.01); *C23C 14/545* (2013.01);
(Continued)

(58) Field of Classification Search
CPC ... C23C 14/3407; C23C 14/35; C23C 14/351; H01J 37/3455; H01J 37/3458; H01L 22/26; H01L 22/12
See application file for complete search history.

(56) References Cited

U.S. PATENT DOCUMENTS 6,464,841 B1* 10/2002 Hurwitt .................. C23C 14/35
204/192.12
6,497,796 B1* 12/2002 Ashtiani ............. H01J 37/3405
204/298.18
(Continued)

FOREIGN PATENT DOCUMENTS

CN 101532124 A 9/2009
CN 109750265 A 5/2019
(Continued)

*Primary Examiner* — Jaehwan Oh
(74) *Attorney, Agent, or Firm* — Seed IP Law Group

(57) ABSTRACT

A deposition system provides a feature that may reduce costs of the sputtering process by increasing a target change interval. The deposition system provides an array of magnet members which generate a magnetic field and redirect the magnetic field based on target thickness measurement data. To adjust or redirect the magnetic field, at least one of the magnet members in the array tilts to focus on an area of the target where more target material remains than other areas. As a result, more ion, e.g., argon ion bombardment occurs on the area, creating more uniform erosion on the target surface.

20 Claims, 12 Drawing Sheets

(51) Int. Cl.
   *C23C 14/54*   (2006.01)
   *H01J 37/32*   (2006.01)
   *H01J 37/34*   (2006.01)

(52) U.S. Cl.
   CPC .... *H01J 37/32715* (2013.01); *H01J 37/3455*
               (2013.01); *H01J 37/3458* (2013.01)

(56) References Cited

U.S. PATENT DOCUMENTS

| | | |
|---|---|---|
| 8,137,519 B2 | 3/2012 | Itagaki et al. |
| 10,844,477 B2 | 11/2020 | Chu et al. |
| 2004/0178056 A1* | 9/2004 | De Bosscher ...... H01J 37/3461 |
| | | 204/298.22 |
| 2009/0229970 A1* | 9/2009 | Itagaki ................ C23C 14/545 |
| | | 204/298.16 |
| 2009/0277780 A1* | 11/2009 | Jaderberg ................ C23C 14/35 |
| | | 204/298.37 |
| 2011/0220494 A1* | 9/2011 | Ding ................... H01J 37/3408 |
| | | 204/298.16 |
| 2011/0240468 A1 | 10/2011 | Hollars |

FOREIGN PATENT DOCUMENTS

| | | |
|---|---|---|
| CN | 110468380 A | 11/2019 |
| CN | 110965033 A | 4/2020 |
| EP | 2317537 A1 | 5/2011 |
| TW | 201918574 A | 5/2019 |

\* cited by examiner

DEPOSITION SYSTEM AND METHOD

BACKGROUND

To produce semiconductor devices, a semiconductor substrate, such a silicon wafer, which is a raw material for the semiconductor devices, must go through a sequence of complicated and precise process steps such as diffusion, ion implantation, chemical vapor deposition, photolithography, etch, physical vapor deposition, chemical mechanical polishing, and electrochemical plating.

The physical vapor deposition (PVD) is generally used to deposit one or more layers on the semiconductor substrate. For example, sputtering, a form of the PVD, is commonly used in the semiconductor fabrication process to deposit complex alloys and metals, such as silver, copper, brass, titanium, silicon, silicon nitride, and carbon nitride, on the substrate. The sputtering includes a target (source), and a substrate (wafer) positioned in parallel to each other in a vacuum enclosure (chamber). The target (cathode) is electrically grounded while the substrate (anode) has positive potential. Argon gas, which is relatively heavy and is a chemically inert gas, is commonly used as the sputtering ion species in the sputtering process. When the argon gas is introduced into the chamber, a plurality of collisions occurs with electrons released from the cathode. That causes the argon gas to lose its outer electrons and become positively charged argon ions. The positively charged argon ions are strongly attracted to the negative potential of the cathode target. When the positively charged argon ions strike the target surface, the momentum of the positively charged argon ions transfers to the target material to dislodge one or more atoms which eventually deposit on the substrate.

The sputtering may employ magnets configured behind and around the target to attract more positively charged ions by trapping electrons near the surface of the target which results in more argon ion bombardment on the target surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
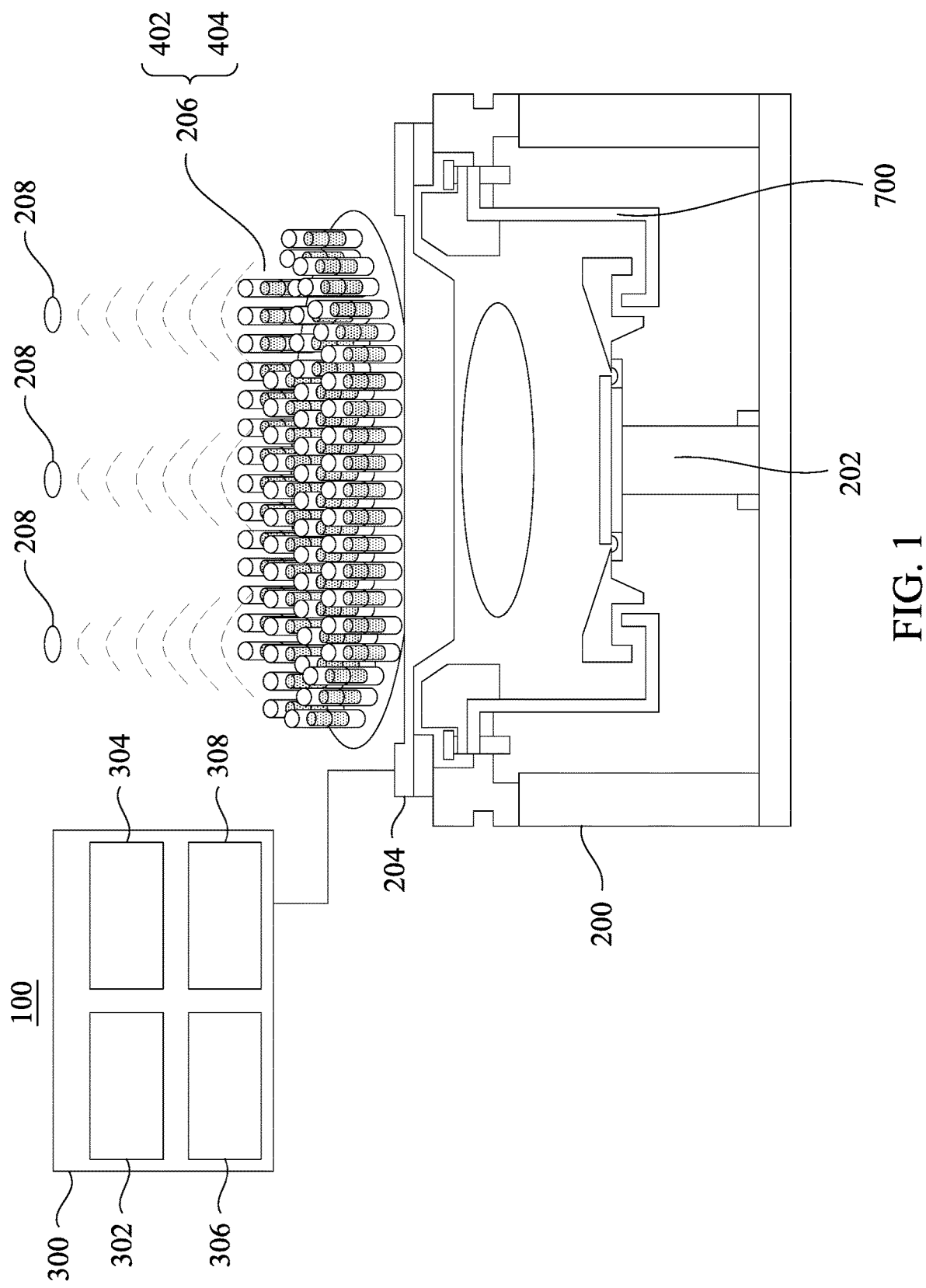
FIG. 1 is a sectional view of overall deposition system 100 according to one or more embodiments in the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments in accordance with the subject matter described herein include a deposition system that is able to change a direction of a magnetic field by adjusting orientation of one or more magnet members positioned behind (and/or around) a target.

Embodiments of such deposition systems include an array of magnet members behind (and/or around) the target and a controller configured to control the orientation of the magnet members. For non-limiting example, at least some of the magnet members in the array of magnet members are tiltable collectively or individually. By tilting the magnet members collectively or individually, the magnetic field generated by the tiltable magnet members is redirected from a default location to a target location on the target. As a result, a magnitude of the magnetic field applied to the target location changes. In other words, a deposition system in accordance with some embodiments described herein can selectively adjust an amount or magnitude of the magnetic field applied to a specific location on the target. By increasing the amount of the magnetic field applied to the specific location using the tiltable magnet members, an ion bombardment on the specific location on the target also increases. The higher or increased ion bombardment means more target material (e.g., metal atoms) are dislodged from the specific location of the target. Ultimately, the dislodged material from the specific location of the target is deposited on a substrate.

FIG. 1 is a sectional view of the deposition system 100 according to one or more embodiments in the present disclosure.

Referring to FIG. 1, the deposition system 100 includes a substrate process chamber 200, a substrate chuck 202 in the substrate process chamber 200, a target 204 enclosing the substrate process chamber 200, an array of magnet members 206 located above the target 204, and a controller 300. In accordance with one or more embodiments of the present disclosure, the array of magnet members 206 includes at least one permanent magnet member 402 and at least one electromagnet 404 member. In some embodiments, at least one of the magnet members 402, 404 in the array of magnet members 206 is tiltable. Some embodiments of the tiltable magnet member are also rotatable. At least some of the magnet members 402, 404 in the array of magnet members 206 are capable of being tiltable (and/or rotatable) collectively or individually in one or more embodiments of the present disclosure.

As used herein, unless otherwise specifically indicated, the term "rotatable magnet members" refers to one or more rotatable magnet members that are capable of rotating with respect to a vertical axis that is disposed perpendicular (or at a certain angle) to a horizontal line that is parallel to an upper surface of the target 204.

As used herein, unless otherwise specifically indicated, the term "tiltable magnet members" refers to one or more tiltable magnet members that are capable of tilting by changing a slope between the tiltable magnet and the horizontal line that is parallel to the upper surface of the target 204.

As used herein, unless otherwise specifically indicated, the term "tiltable and rotatable magnet members" or "rotatable and rotatable magnet members" refers to one or more tiltable and rotatable magnet members that are capable of tilting and rotating as defined above.

Permanent magnet member 402 is constructed of any suitable material that can stay magnetized over a long period without altering its magnetic property and is resistant to degradation caused by the external magnetic field. For example, the permanent magnet member 402 may be constructed of alnico alloy, ferrite and the like, an alloy of neodymium, iron and boron, and combinations thereof. Permanent magnet member 402 is not limited to being constructed from the exemplary material mentioned above but may be formed of any material that can stay magnetized over a long period without altering its magnetic property and is resistant to degradation caused by the external magnetic field.

Electromagnet member 404 is constructed of any suitable material that can stay magnetized when an electric current is applied to the material and is resistant to degradation caused by the external magnetic field. For example, the electromagnet member 404 may be constructed of a coil of copper wire, or other electrically conductive wire, wound around a core of a material that when an electric current is flowed through the electrically conductive wire produces a magnetic field. Examples of materials suitable as a core for an electromagnet include, iron, nickel or cobalt. Electromagnet member 404 is not limited to being constructed from the exemplary material mentioned above but may be formed of any material that can stay magnetized when the electric current is applied to the material and is resistant to degradation caused by the external magnetic field.

Controller 300 controls orientation of the tiltable and/or rotatable magnet members among the permanent magnet members 402 and the electromagnet members 404. In accordance with one or more embodiments of the present disclosure, the controller 300 includes an input circuitry 302, a memory 304, a processor 306, and an output circuitry 308. Controller 300 includes the (computer) processor 306 configured to perform the various functions and operations described herein including receiving input data from various data sources (such as the ultrasonic sensor 208 and the metrology tool) via the input circuitry 302 and transmitting output data (tilt signal and rotate signal) via the output circuitry 308. Input circuitry 302 receives target thickness measurements from one or more ultrasonic sensors 208 and thin film thickness measurements from a metrology tool. The target thickness measurements are taken at a plurality of locations of the target 204. The thin film thickness measurements are taken at a plurality of locations of the substrate. In some embodiments, the input circuitry 302 also receives process recipe information such as target thin film thickness from an operator. Details of the input circuitry 302, memory 304, output circuitry 308, ultrasonic sensor 208 and the metrology tool will be provided later in the present disclosure. From the measurements received at the input circuitry 302, the processor 306 determines an average thickness of the target 204 and an average thickness of the thin film 502 (in FIG. 4). Input circuitry 302 may be or include one or more input terminals that are communicatively coupled to any desired number of information sources such as the ultrasonic sensor 208, the metrology tool, and other systems. In some embodiments, the processor 306 also determines at least one of the plurality of locations where the thickness of the thin film 502 is less or more than the average thickness of the thin film 502. Similarly, the processor 306 determines at least one of the plurality of locations where the thickness of the target 204 is less or more than the average thickness of the target 204. Memory 304 stores information received via the input circuitry 302 and the processed data such as the determined location information from the processor 306. Memory 304 may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like. Output circuitry 308 transmits a tilt (and/or rotate) signal to the tiltable (and/or rotatable) magnet members among the permanent magnet members 402 and the electromagnet member 404 based on the determined location. Output circuitry 308 may be or include one or more output terminals that are communicatively coupled to any desired number of components of the deposition system 100 such as the tiltable (and/or rotatable) magnet members. Details of measurements from the thin film 502 and the target 204 will be provided later in the present disclosure.

In accordance with one or more embodiments, the deposition system 100 includes one or more ultrasonic sensors 208 capable of measuring a thickness of the target 204 at a plurality of locations. Ultrasonic sensor 208 can be any type of sensor that is suitable to perform a non-destructive inspection. For example, the ultrasonic sensor 208 can be an ultrasonic sensor positioned above the target 204. Ultrasonic sensor 208 is not limited to an ultrasonic type but may be any type of sensor that can measure the thickness of the target 204 at the plurality of locations in a non-destructive manner. The embodiment illustrated in FIG. 1 shows that three ultrasonic sensors 208 are located above the target 204. However, the present disclosure does not limit the location of the ultrasonic sensor 208. Ultrasonic sensor 208 can be placed in any suitable locations for monitoring the thickness of the target 204.

Figure 2:
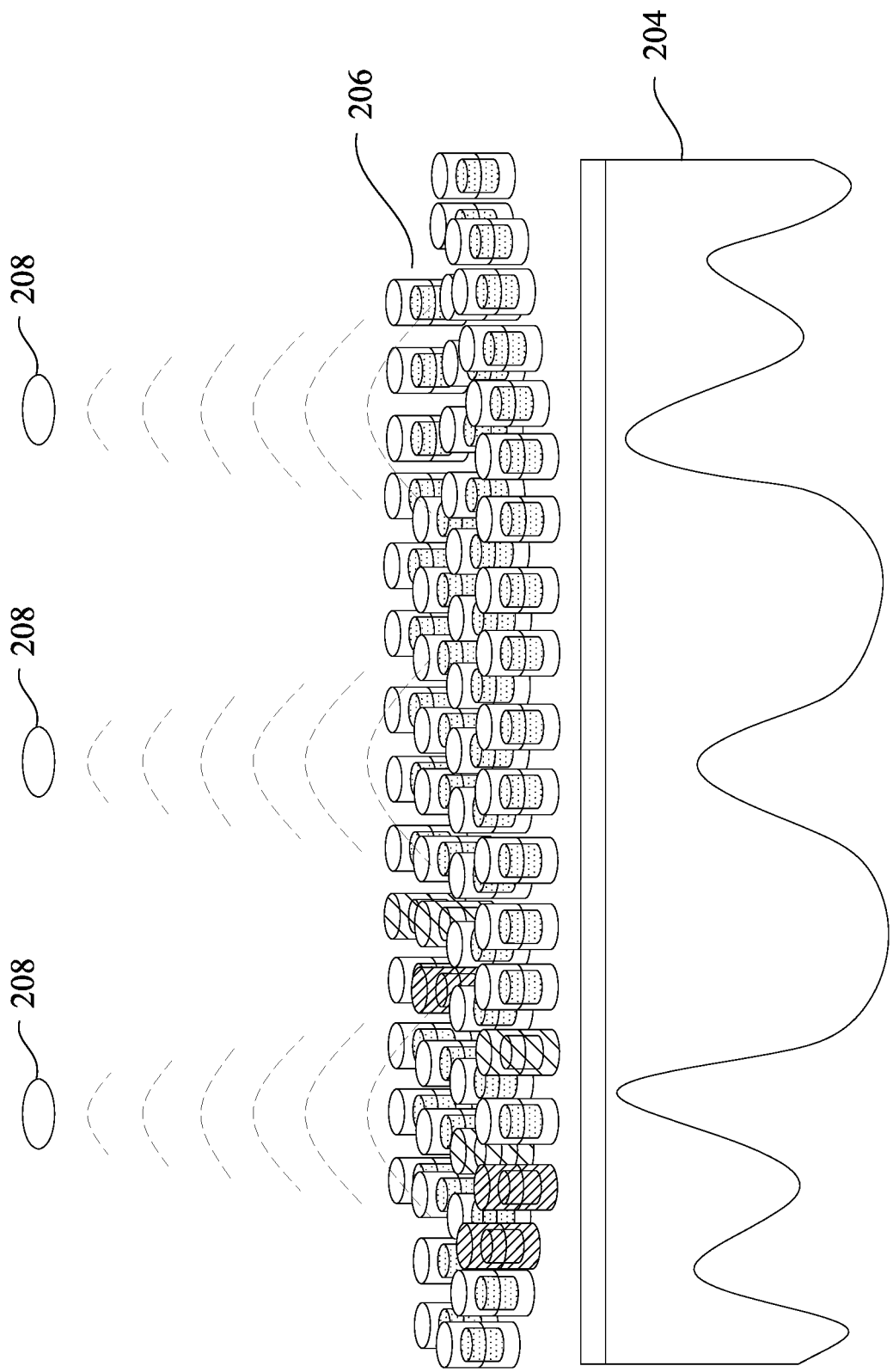
FIG. 2 is a sectional view of a target 204 along with an array of magnet members 206 and ultrasonic sensors 208 in the deposition system 100 according to one or more embodiments in the present disclosure.

FIG. 2 is a sectional view of the target 204 along with the array of magnet members 206 and the ultrasonic sensors 208 in the deposition system 100 according to one or more embodiments in the present disclosure.

Referring to FIG. 2, the deposition system 100 according to one or more embodiments of the present disclosure includes three ultrasonic sensors 208 and the array of magnet members 206 on or above the target 204.

In the illustrated embodiment, three ultrasonic sensors 208 are located above the target 204. Each of the ultrasonic sensors 208 measures the thickness of the target 204 in a respective area using at least one non-destructive testing technique based on the propagation of ultrasonic waves. For instance, in accordance with embodiments illustrated in FIG. 2, each of the ultrasonic sensors 208 generates a short ultrasonic pulse wave with center frequencies between 0.1 MHz and 50 MHz and propagates the ultrasonic pulse waves into the target 204. Ultrasonic sensors 208 measure the thickness of the target 204 in the respective area by comparing the initial ultrasonic pulse waves generated by the ultrasonic sensors 208 and the ultrasonic pulse waves reflected from the target 204.

Embodiments in accordance with the present disclosure are not limited to using the short ultrasonic pulse-wave with center frequencies between 0.1 MHz and 50 MHz. For non-limiting example, in other embodiments in accordance with the present disclosure, the center frequency is below 0.1 MHz or above 50 MHZ. In accordance with embodiments of the present disclosure, a waveform generated by the ultrasonic sensor 208 is not limited to the pulse wave. For non-limiting example, in other embodiments in accordance with the present disclosure, the waveform can be in any suitable waveform capable of measuring a thickness of the target 204 such as a sine waveform, triangle waveform, and sawtooth waveform.

Embodiments in accordance with the present disclosure are not limited to using three ultrasonic sensors 208. For instance, in other embodiments in accordance with the present disclosure, two or more ultrasonic sensors 208 are (evenly or unevenly) positioned above the target 204 based on the size of the target 204. However, only one ultrasonic sensor 208 may be positioned on the target 204 if having one ultrasonic sensor 208 is sufficient to measure the thickness of the target 204 at the plurality of locations. Alternatively, one or more moveable ultrasonic sensor may be used to measure the thickness of the target at the plurality of locations.

In accordance with the embodiment illustrated in FIG. 2, the controller 300 receives the thickness measurements from each of the ultrasonic sensors 208. Based on the thickness measurement received, the controller 300 determines one or more locations on a surface the target 204 to where the more magnetic field will be focused. Based on the determined location, the controller 300 transmits a tilt (and/or rotate) signal to corresponding magnet members 402, 404 in the array of magnet members 206 to cause the respective magnet members 402, 404 to tilt and/or rotate. Such tilt or rotation causing a change in focus of the magnetic field generated by the array of magnet members 206. Such change in focus of the magnetic field means that one or more locations on a surface of the target 204 is exposed to a larger magnetic field than other locations on the surface of the target 204. As used herein, unless otherwise specifically indicated, the term "corresponding magnet members" refers to one or more tiltable (and/or rotatable) magnet members positioned within a certain range from the determined location that, by tilting (and/or rotating) the one or more magnet members, more magnetic field is applied to the determined location. For instance, by tilting the corresponding magnet members 402, 404, the intensity of the magnetic field applied to the determined location on the target 204 increases.

In accordance with one or more embodiments of the present disclosure, the controller 300 receives raw measurements from each of the ultrasonic sensors 208 such as the initial ultrasonic pulse waves generated by the ultrasonic sensors 208 and the ultrasonic pulse waves reflected from the target 204 via the input circuitry 302. Processor 306 of the controller 300 measures the thickness of the target 204 in the respective area by comparing the initial ultrasonic pulse waves generated by the ultrasonic sensors 208 and the ultrasonic pulse waves reflected from the target 204. Based on the thickness measurement, the controller 300 determines one or more locations on a surface the target 204 to where the more magnetic field will be focused. Based on the determined location, the controller 300 transmits a tilt (and/or rotate) signal to corresponding magnet members 402, 404 in the array of magnet members 206 to cause the respective magnet members 402, 404 to tilt and/or rotate. Such tilt or rotation causing a change in focus of the magnetic field generated by the array of magnet members 206. Such change in focus of the magnetic field means that one or more locations on a surface of the target 204 is exposed to a larger magnetic field than other locations on the surface of the target 204.

Figure 3:
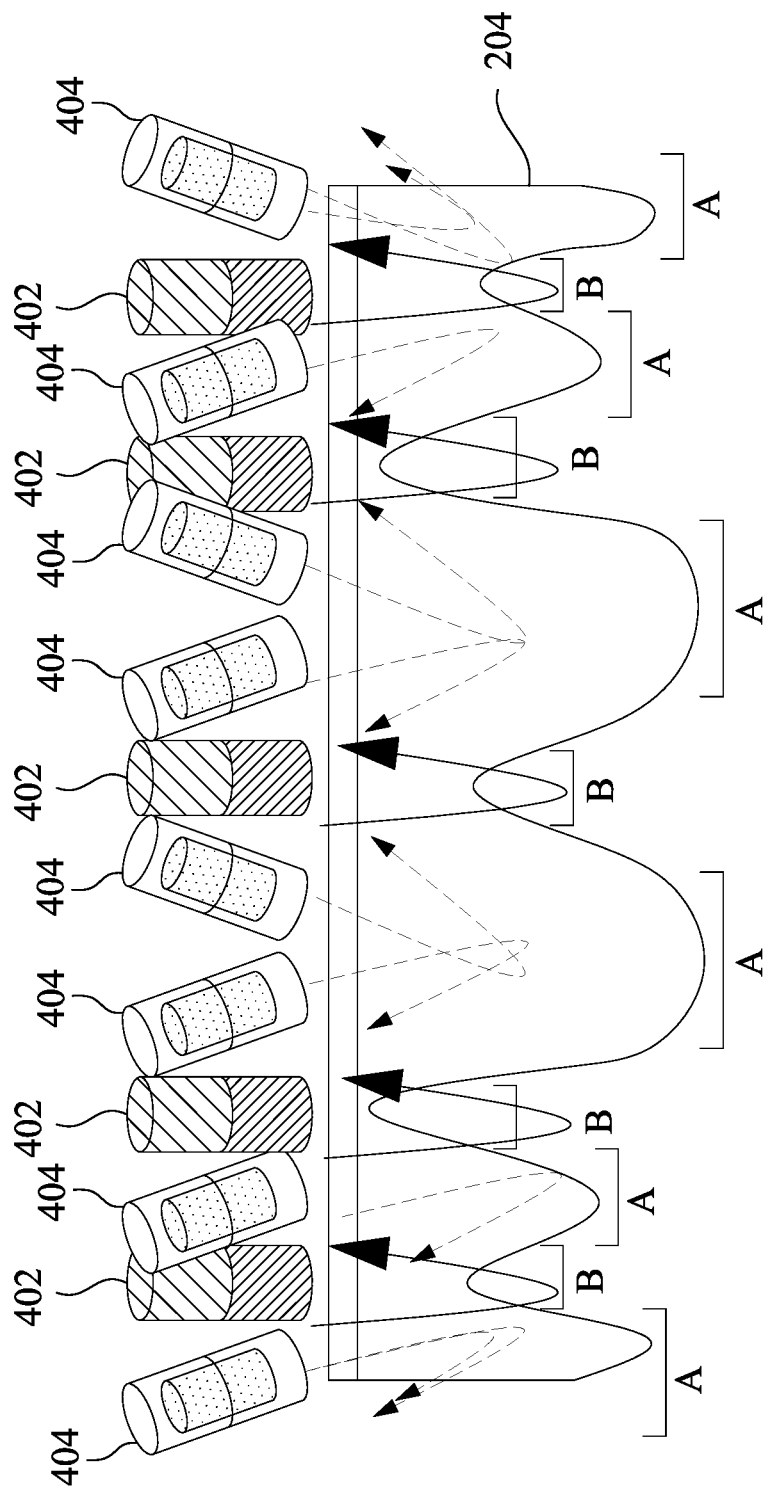
FIG. 3 is a sectional view of the array of the magnet members 206 generating the magnetic field focusing on multiple determined locations on the target 204.

FIG. 3 is a sectional view of the array of the magnet members 206 generating the magnetic field focusing on multiple determined locations on the target 204.

Referring to FIG. 3, in the deposition system 100 according to one or more embodiments of the present disclosure, the controller 300 transmits the tilt signal to corresponding magnet members 404 in the array of the magnet member 206. The tilt signal is generated by the controller 300 to change the orientation of the corresponding magnet members 404 based on the thickness measurement measured by one or more of the ultrasonic sensors 208. By tilting each of the corresponding magnet members 404 at a certain angle towards a matching determined location, a magnitude of the magnetic field applied to each of the determined locations on the target 204 increases.

In accordance with the embodiment illustrated in FIG. 3, eight electromagnet members 404 and five permanent magnet members 402 are arranged together to form the array of the magnet member 206. The embodiment illustrated in FIG. 3 shows that the electromagnet members 404 are tiltable. However, the present disclosure does not limit only the electromagnet members 404 to being tiltable. In other embodiments in accordance with the present disclosure, the permanent magnet members 402 are also tiltable.

Based on the tilt signal transmitted from the controller 300 to the eight tiltable electromagnet members 404, each of the tiltable electromagnet magnet members 404 tilts to redirect the magnetic field towards the determined locations on the target 204.

In the embodiment illustrated in FIG. 3, each of the electromagnet members 404 tilts at certain angles that redirect magnetic field generated by the electromagnet members 404 to the closest target surface A where more target material remains. Due to the magnetic field generated by the electromagnet members 404, the ion bombardment on each of the target surface A increases.

As discussed above, embodiments in accordance with the present disclosure are not limited to tilting the corresponding electromagnet members 404 to redirect the magnetic field. For example, in other embodiments in accordance with the present disclosure, the magnetic field is adjusted or redirected by the tilting of at least one corresponding permanent magnet member 402 or at least one corresponding permanent magnet member 402 and at least one corresponding electromagnet member 404 together. In some embodiments of the present disclosure, at least one type of the magnet members 402, 404 is also rotatable to precisely redirect the magnetic field.

Advantages of being able to redirect and focus the magnetic field having the tiltable magnet members 402, 404 include a substantial cost savings by extending an interval between the target change out. For example, the targets 204 with sufficient material thickness in some locations are sometimes discarded prematurely due to an uneven target surface resulting from uneven consumption or erosion of the target material at different locations of the target. However, by redirecting the magnetic field, the erosion profile on the target 204 becomes more even, and a larger percentage of the target material is utilized before the target is replaced. At the same time, a periodic maintenance interval for the substrate process chamber 200 also can be increased.

In accordance with one or more embodiments of the present disclosure, in addition to transmitting the tilt signal which controls the tilting angle for the magnet members 402, 404, the controller 300 is also configured to transmit a rotate signal. Controller 300 also controls rotating speed for each rotatable magnet member 402, 404. In some embodiments, at least some of the magnet members 402, 404 rotate at a certain speed to provide a more uniform electromagnet field. In one or more embodiments of the present disclosure, the rotation for the magnet members 402, 404 is set between 60 rpm and 120 rpm. Embodiments in accordance with the present disclosure are not limited to rotating the magnet members 402, 404 between 60 rpm and 120 rpm. For example, in other embodiments in accordance with the present disclosure, the rotation of the magnet members 402, 404 is set below 60 rpm such as zero rpm or above 120 rpm. In accordance with embodiments of the present disclosure, the particular rpm at which each of the magnet members 402, 404 is rotated is chosen such that it is based on a process requirement set by an operator. As discussed above, in some embodiments of the present disclosure, at least one type of the magnet member 402, 404 is also rotatable to precisely redirect the magnetic field to the determined location.

In accordance with one or more embodiments of present disclosure, in addition to or instead of transmitting the tilt signal which controls the tilting angle for the magnet members 402, 404, the controller 300 controls a current provided to each of the electromagnet members 404 in the array of the magnet members 206 based on the thickness measurement. For example, by changing the current applied to the electromagnets 404, the magnitude of the magnetic field applied to the specific location on the target 204 also changes. In some other embodiments of the present disclosure, the controller 300 controls the current provided to at least some of the electromagnet members 404.

In some embodiments of the present disclosure, the controller 300 applies more current to one or more corresponding electromagnet members 404 to create a stronger magnetic field that surrounds the target surface A where more target material remains. Here, "corresponding magnet members" refers to one or more magnet members 402, 404 positioned within a certain range from the determined location. Due to the stronger magnetic field generated by the electromagnet members 404, the ion bombardment on each of the target surfaces A increases.

In some embodiments of the present disclosure, the controller 300 applies less or no current to one or more non-corresponding electromagnet members 404 to create a weaker magnetic field that surrounds the target surface B where less or no target material remains. Due to the weaker magnetic field generated by the electromagnet member 404, the ion bombardment on each of the target surfaces B decreases.

In some embodiments of the present disclosure, the controller 300 applies more current to one or more corresponding electromagnet members 404 to create a stronger magnetic field that surrounds the target surface A where more target material remains. At the same time, the controller 300 applies less or no current to one or more non-corresponding electromagnet members 404 to create a weaker magnetic field that surrounds the corresponding target surface B where less or no target material remains.

In some embodiments of the present disclosure, based on the measurement from the ultrasonic sensors 208, the processor 306 of the controller 300 determines an average thickness of the target 204. Controller 300 determines one or more locations where the thickness of the target 204 is more than the average thickness. Based on the determined locations on the target, the controller 300 adjusts the magnetic field to increase the ion bombardment on the surface of the target 204 at the determined locations. As discussed above, the controller 300 transmits the tilt (and/or rotate) signal to corresponding magnet members 402, 404 to increase the ion bombardment on the determined locations. In some embodiments, the controller 300 supplies more current to the corresponding magnet members 404 to increase the ion bombardment on the determined locations. In some embodiments, the controller 300 supplies no or less current to non-corresponding magnet members 404. In some embodiments, the controller 300 transmits the rotate signal to corresponding magnet member 402, 404 to increase the ion bombardment on the determined locations. Controller 300 may control the magnet members 402, 404 using any of the combinations of methods described above.

Figure 4:
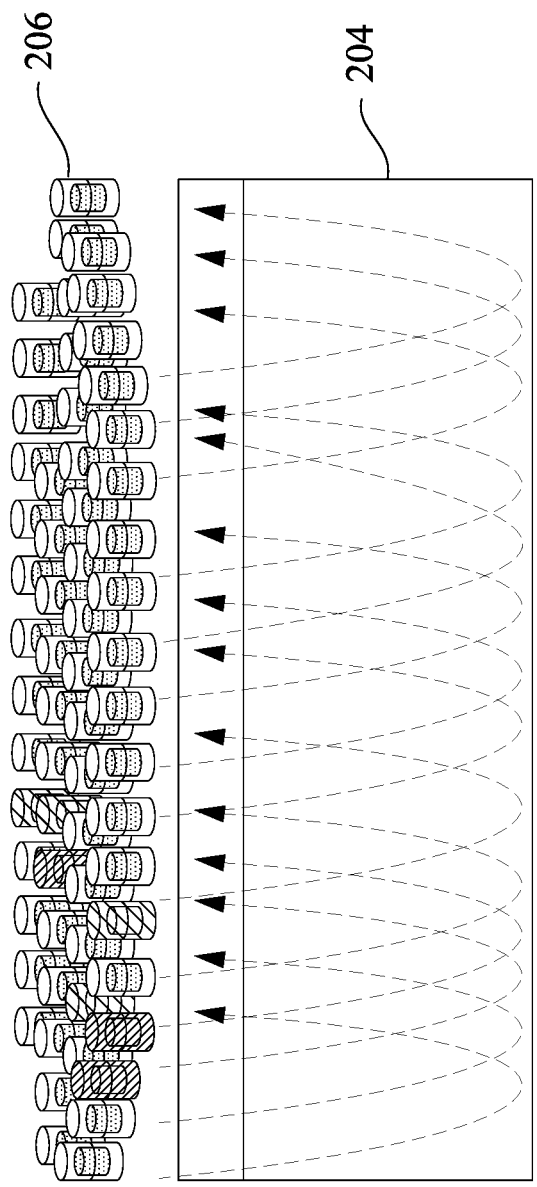
FIG. 4 is a sectional view illustrating an exemplary result of the deposition system 100 before applying any adjustments to the magnet members 402, 404.
Figure 4:
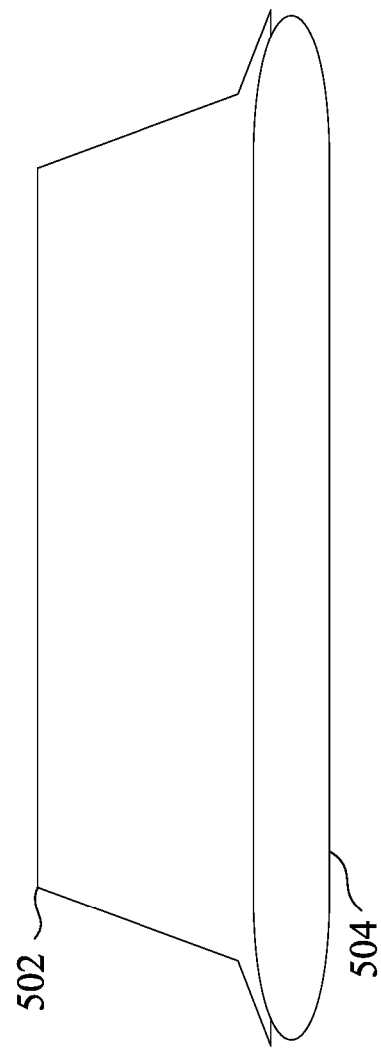

FIG. 4 is a sectional view illustrating an exemplary result of the deposition system 100 before applying any adjustments to the magnet members 402, 404.

Referring to FIG. 4, the deposition system 100 deposits the thin film 502 on the initial substrate 504 by running a process recipe in the illustrated embodiment. The process recipe includes several process conditions, such as deposition time, chamber pressure, and argon gas flowing rate, to deposit the thin film 502 on the initial substrate 504 within a target range of thickness.

An illustrated thin film 502 on the initial substrate 504 does not have a uniform thickness since a thickness of the thin film 502 on the edge of the initial substrate 504 is less than the target range of the thickness shown in the center area of the thin film 502. After deposition of the thin film 502 on the initial substrate 504, the initial substrate 504 is transferred to a metrology tool. At the metrology tool, the metrology tool measures the thickness of the thin film 502 on the initial substrate 504 at a plurality of locations.

Figure 5:
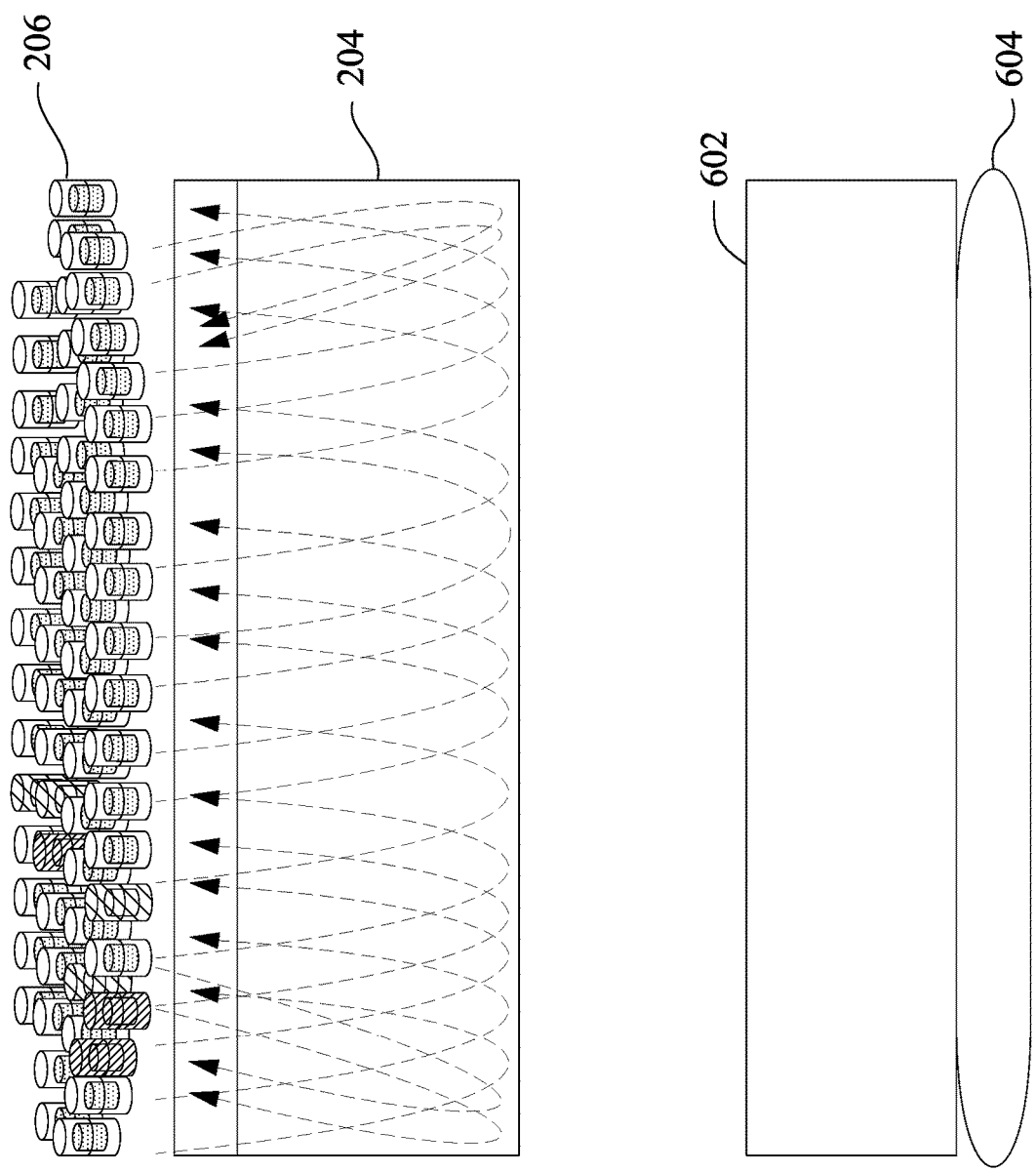
FIG. 5 is a sectional view illustrating an exemplary result of the deposition system 100 after applying adjustments to the magnet members 402, 404 according to one or more embodiments of the present disclosure.

FIG. 5 is a sectional view illustrating an exemplary result of the deposition system 100 after applying adjustments to the magnet members 402, 404 according to one or more embodiments of the present disclosure.

Referring to FIG. 5, the controller 300 of the deposition system 100 receives the thickness measurement data from the metrology tool. Based on the measurement data, the controller 300 determines one or more locations where the thickness of the thin film 502 on the initial substrate 504 is less than the target range of the thickness. In the example illustrated in FIG. 5, the controller 300 determines that the thin film 502 on the edge of the initial substrate 504 has less thickness than the target range of thickness. Based on the determined location on the initial substrate 504, the controller 300 adjusts the magnetic field using any combinations of the methods described above to increase the ion bombardment on a surface of the target 204 that is above or directly above from the determined location on the initial substrate 504 for the subsequent substrate 604. For example, in one or more embodiments of the present disclosure, the controller 300 transmits the tilt (and/or rotate) signal to corresponding magnet members 402, 404 to increase the ion bombardment on the surface of the target 204 that is above or directly above from the determined location on the initial substrate 504. In some embodiments of the present disclosure, in addition to or instead of transmitting the tilt signal which controls the tilting angle for the magnet members 402, 404, the controller 300 supplies more current to the corresponding magnet members 404 to increase the ion bombardment on the surface of the target 204 that is above or directly above from the determined location on the initial substrate 504. In other words, the controller 300 adjusts the magnetic field using any combinations of the methods described above based on measurement data collected from the initial substrate 504 for the subsequent substrate 604.

As shown in FIG. 5, in the deposition system 100 according to one or more embodiments of the present disclosure, the controller 300 transmits the tilt (and/or rotate) signal to corresponding magnet members 402, 404 to increase the ion bombardment on the edge of the target 204 by directing more magnetic field to the edge of the target 204 based on measurement from the initial substrate 504. As a result, uniformity of the subsequent thin film 602 on the subsequent substrate 604 increases by depositing more target material on the edge of the subsequent substrate 604.

One of the advantages of having the controller 300 which is capable of controlling the uniformity of the thin film layer on the substrate is saving valuable time during the process qualification process. To increase the uniformity of thin film on the substrate, a team of process engineers must go through a lengthy qualification process that includes fine-tuning several process conditions. However, the controller 300 of the deposit system 100 can expedite the qualification process since the controller 300 is capable of fine-tuning the process based on the thickness measurement from the metrology tool.

In some embodiments of the present disclosure, the controller 300 receives the thickness measurement from the metrology tool. Based on the measurement, the controller 300 determines an average thickness of the thin film on the substrate. Controller 300 determines one or more locations where the thickness of the thin film 502 is less than the determined average thickness. Based on the determined locations on the initial substrate 504, the controller 300 adjusts the magnetic field to increase the ion bombardment on the surface of the target 204 which is above or directly above the determined locations.

As discussed above, the controller 300 is capable of transmitting the tilt (and/or rotate) signal to corresponding magnet members 402, 404 to increase the ion bombardment on the surface of the target 204 that is likely to affect the thin film thickness at the determined locations. In addition to or instead of transmitting the tilt signal which controls the tilting angle for the magnet members 402, 404, the controller 300 is capable of supplying more current to the corresponding magnet members 404 to increase the ion bombardment rates on the surface of the target 204 that is likely affect the thin film thickness at the determined locations.

One of the advantages of having the controller 300 which is capable of controlling the uniformity of the thin film on the subsequent substrate 604 based on the determined average thickness of the thin film is providing the operator a less invasive method of increasing the uniformity. In other words, the controller 300 can provide some slight improvement without affecting the overall process result.

Figure 6:
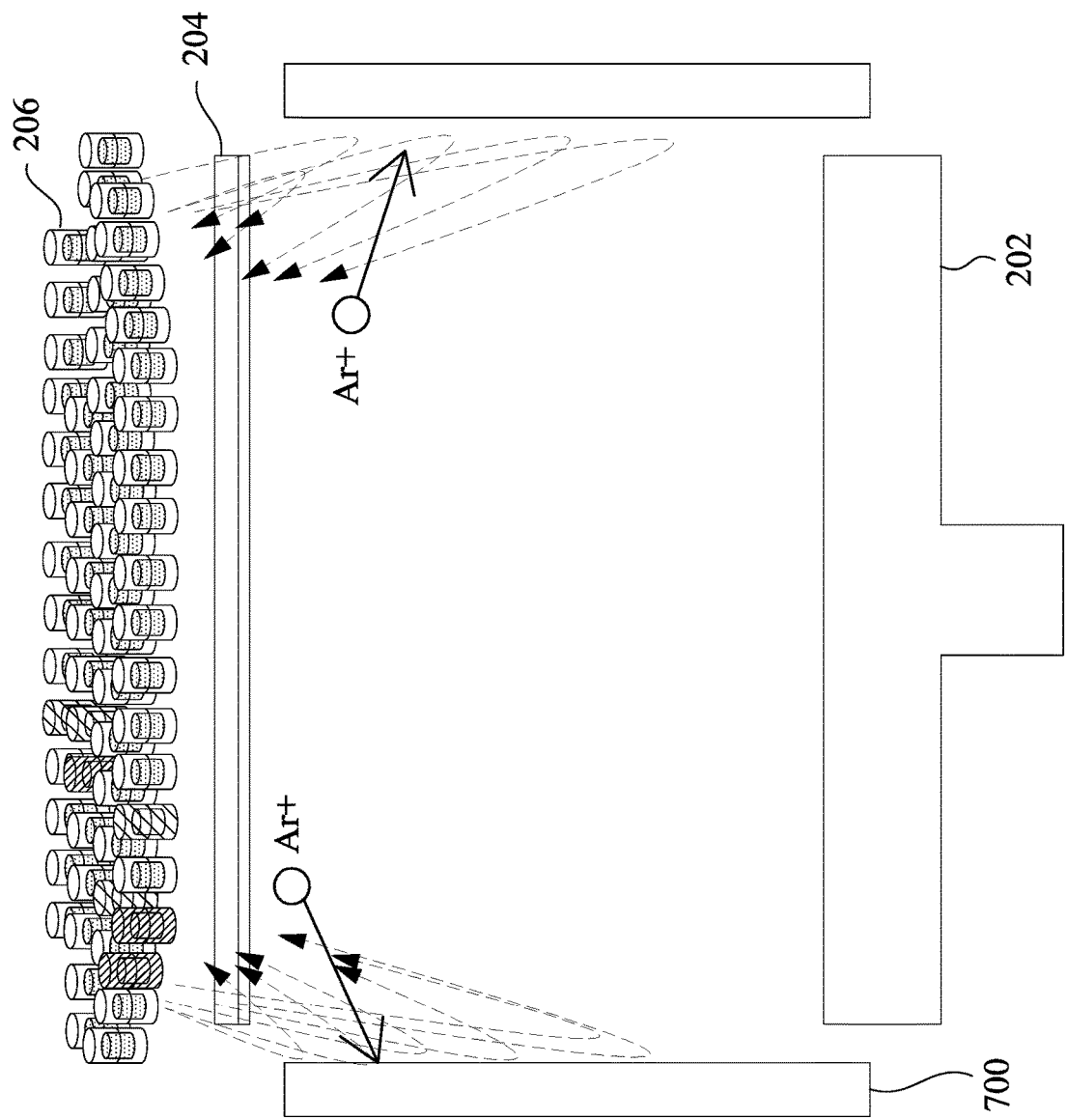
FIG. 6 is a sectional view illustrating how the array of the magnet members 206 is used to clean a process shield in a substrate process chamber 200 according to one or more embodiments of the present disclosure.

FIG. 6 is a sectional view illustrating how the array of the magnet members 206 is used to clean a process shield in the substrate process chamber 200 according to one or more embodiments of the present disclosure.

Referring to FIG. 6, the deposition system 100 according to one or more embodiments of the present disclosure includes the controller 300, the array of magnet members 206 on the target 204, and process shield 700. Process shield 700 covers the inner wall of the substrate process chamber 200 to prevent the inner wall from being deposited on during the sputtering process.

In the illustrated embodiment, the controller 300 of the deposition system 100 transmits the tilt (and/or rotate) signal to the magnet members 402, 404 on the peripheral area of the target 204. By tilting and/or rotating the magnet members 402, 404 (on the peripheral area) at certain angles toward the process shield 700, the controller 300 redirects the magnetic field to an inner surface of the process shield 700. As a result, the inner surface of the process shield 700 is bombarded with the argon ions. Using the ion bombardment on the surface of the process shield 700, deposited target material on the process shield 700 can be cleaned without venting the substrate process chamber 200. In some embodiments of the present disclosure, the ion bombardment on the surface of a newly installed process shield 700 is used to remove any contaminated materials, such as dust, on the surface of the process shield 700.

Figure 7:
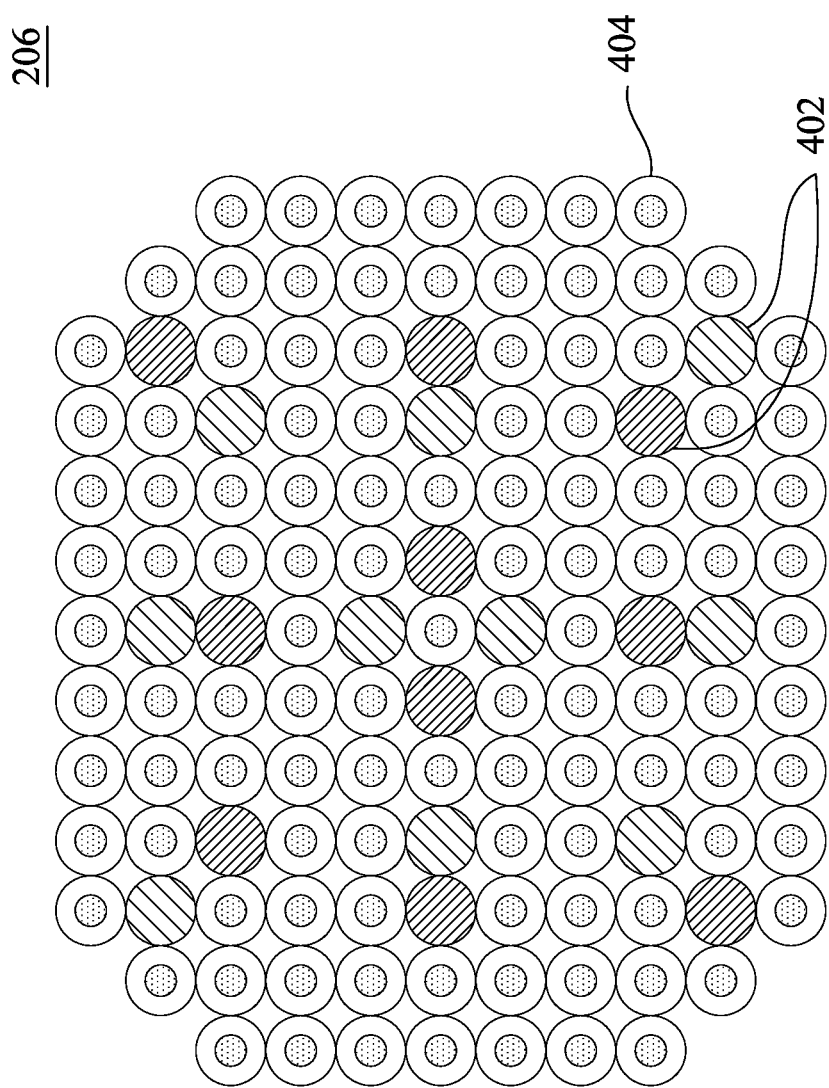
FIG. 7 is a top view of the array of magnet members 206 according to one or more embodiments of the present disclosure.

FIG. 7 is a top view of the array of magnet members 206 according to one or more embodiments of the present disclosure.

Referring to FIG. 7, the deposition system 100 according to one or more embodiments of the present disclosure includes the array of the magnet members 206 including at least one permanent magnet member 402 and at least one electromagnet member 404. The array of magnet members 206 is not limited to being constructed with the two types of magnet members mentioned above but may be formed of one type of magnet member only.

As discussed above, the permanent magnet member 402 is constructed of any suitable material that can stay magnetized over a long period without altering its magnetic property and is resistant to degradation caused by the external magnetic field. For example, the permanent magnet member 402 may be constructed of alnico alloy, ferrite and the like, an alloy of neodymium, iron and boron, and combinations thereof. In some embodiments of the present disclosure, the permanent magnet member 402 is capable of at least one of movements such as tiltable and rotatable.

As discussed above, the electromagnet member 404 is constructed of any suitable material that can stay magnetized when an electric current is applied to the material and is resistant to degradation caused by the external magnetic field. For example, the electromagnet member 404 may be constructed of a coil of copper wire wound around a core made from iron, nickel or cobalt. In some embodiments of the present disclosure, the electromagnet member 404 is capable of at least one of movements such as tiltable and rotatable.

In the embodiment illustrated in FIG. 7, the permanent magnet members 402 are in an asterisk formation on the target 204 (not shown in FIG. 7) surrounded by the electromagnet members 404. However, embodiments in accordance with the present disclosure are not limited to the asterisk or star formation. For example, in other embodiments in accordance with the present disclosure, the permanent magnet members 402 are in a circular formation on the target 204. In accordance with some embodiments of the present disclosure, the particular arrangement of the permanent magnet member 402 is chosen based on a process recipe.

Figure 8:
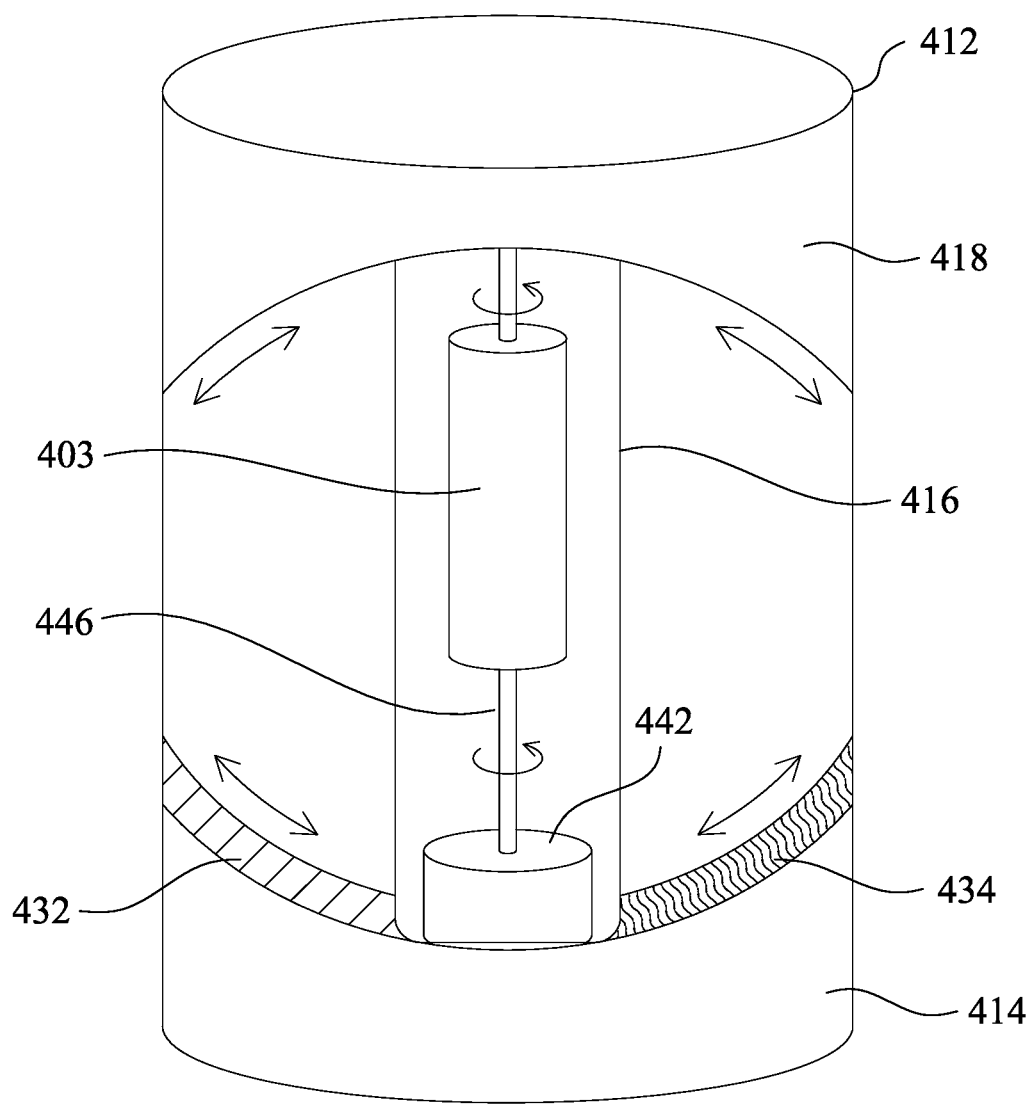
FIGS. 8 and 9 are front and side sectional views of the magnet member 402 according to one or more embodiments.
Figure 9:
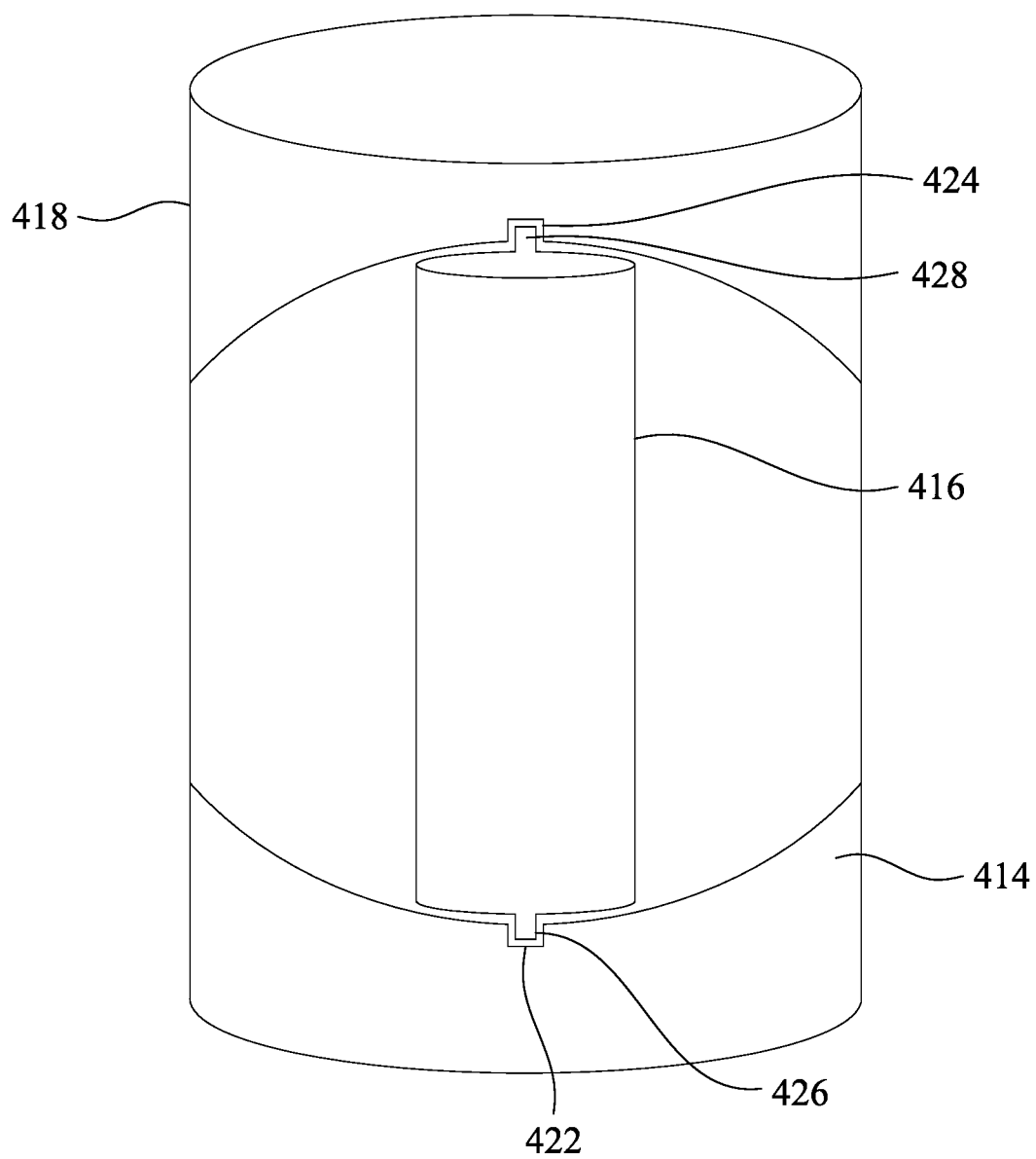

FIGS. 8 and 9 are front and side sectional views of the magnet member 402 according to one or more embodiments.

Referring to FIGS. 8 and 9, the permanent magnet member 402 includes a cylinder body 412 including a first guide member 414, a third guide member 418, and a second guide member 416 located between the first guide member 414 and the third guide member 418. First guide member 414 disposed on the bottom of the cylinder body 412 includes a first sliding groove 422 (not shown in FIG. 8 but shown in FIG. 9). Third guide member 418 disposed on the top of the cylinder body 412 includes a second sliding groove 424 (not shown in FIG. 8 but shown in FIG. 9).

In accordance with the illustrated embodiments of the present disclosure, the second guide member 416 includes a first tongue 426 on a bottom end and a second tongue 428 on an upper end configured to tilt by coupling to the first sliding groove 422 and the second sliding groove 424 respectively. Second guide member 416 is tiltable up to 45 degrees in at least two directions by a first actuator 432 and a second actuator 434.

According to one or more embodiments of the present disclosure, the first actuator 432 and the second actuator 434 are extended or contracted based on the tilt signal from the controller 300. For example, the first actuator 432 extends to push the bottom end of the second guide member 416 to the right (in FIG. 8) and the second actuator 434 contracts to provide room for the bottom end of the second guide member 416 to slide to the right (in FIG. 8). Similarly, the second actuator 434 extends to push the bottom end of the second guide member 416 to the left (in FIG. 8) and the first actuator 432 contracts to provide room for the bottom end of the second guide member 416 to slide to the left (in FIG. 8).

The first actuator 432 and the second actuator 434 are constructed of any suitable material that can extend or contact based on the tilt signal without degradation caused by the external magnetic field. For non-limiting example, the first actuator 432 and the second actuator 434 include at least one of a mechanical actuator, an electrical actuator, or an actuator made with piezoelectric materials such as sodium, lead zirconate titanate, potassium niobite, potassium-sodium niobite, bismuth ferrite, quartz and other suitable ceramic or non-ceramic piezoelectric materials. In some embodiments, the tilt signal includes DC voltage which extends the actuator made with the piezoelectric materials. In the embodiments, the actuator made with the piezoelectric materials contracts as the DC voltage applied to the actuator decreases.

Second guide member 416 includes a permanent magnet 403 coupled to a drive mechanism 442 (i.e., motor and step motor). In the illustrated embodiment in FIG. 8, a step motor is used as the drive mechanism 442 which is coupled to the permanent magnet using the first axle 446. In accordance with some embodiments of the present disclosure, the drive mechanism 442 rotates the permanent magnet 403 based on the rotate signal from the controller 300. In accordance with some embodiments, the drive mechanism 442 is constructed of any suitable enclosure material that can shield the drive mechanism 442 from the external magnetic field if the motor is used to rotate the permanent magnet 403.

Figure 10:
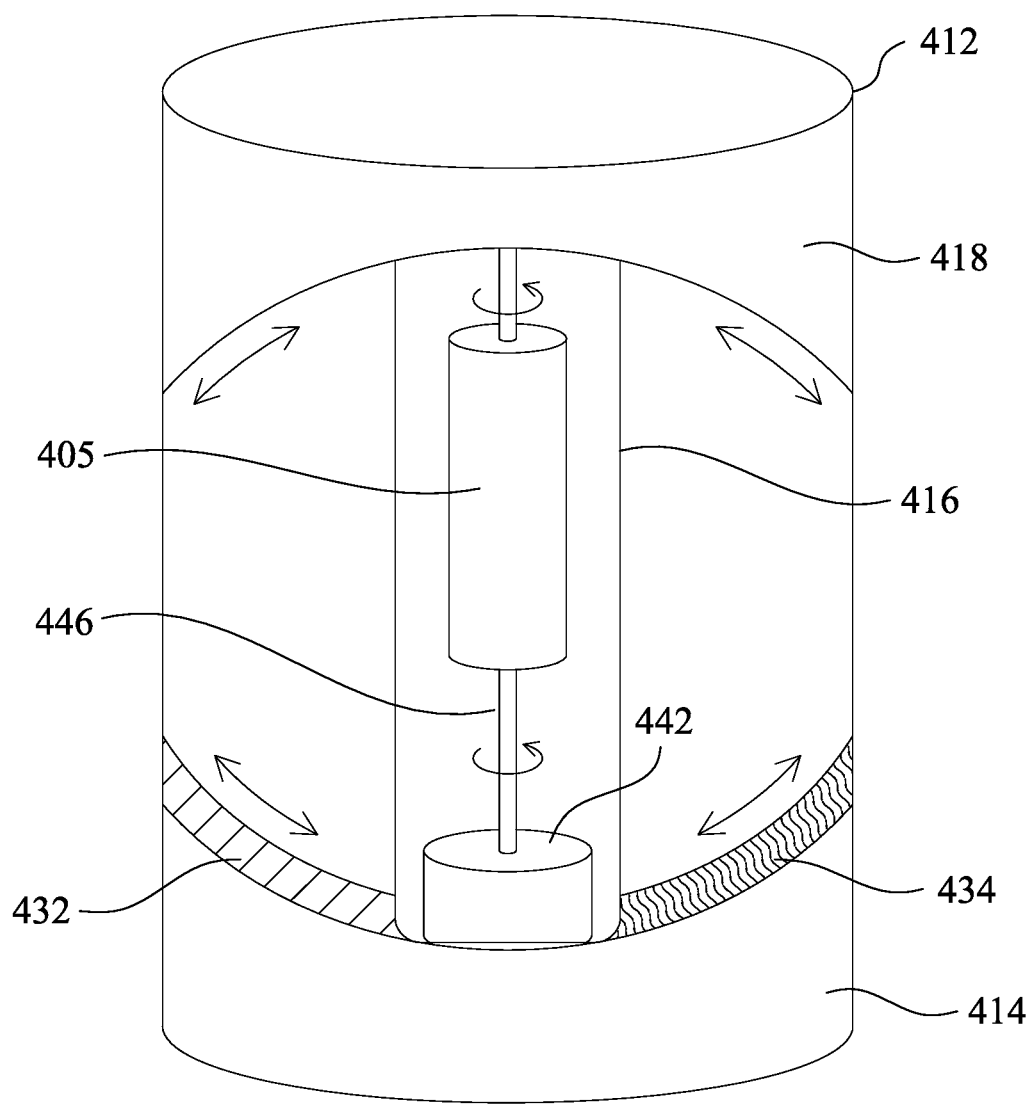
FIG. 10 is a front sectional view of the magnet member 404 according to one or more embodiments.

FIG. 10 is a front sectional view of the magnet member 404 according to one or more embodiments.

Referring to FIG. 10, the electromagnet member 404 includes the first guide member 414, the second guide member 416, and the third guide member 418. However, the electromagnet member 404 includes an electromagnet 405 instead of the permanent magnet 403 described with reference to FIGS. 8 and 9. In accordance with some embodiments of the present disclosure, the controller 300 controls the current supplied to the electromagnet 405 as discussed above to adjust the magnitude of the magnetic field.

Other than the type of the magnet that is used, the embodiment illustrated in FIG. 10 is similar to the embodiment illustrated in FIGS. 8 and 9 and the description of the components of the embodiment of FIGS. 8 and 9 apply to the components of the embodiment illustrated in FIG. 10. Therefore, descriptions for the other components in the embodiment of FIG. 10 are not repeated here.

Figure 11:
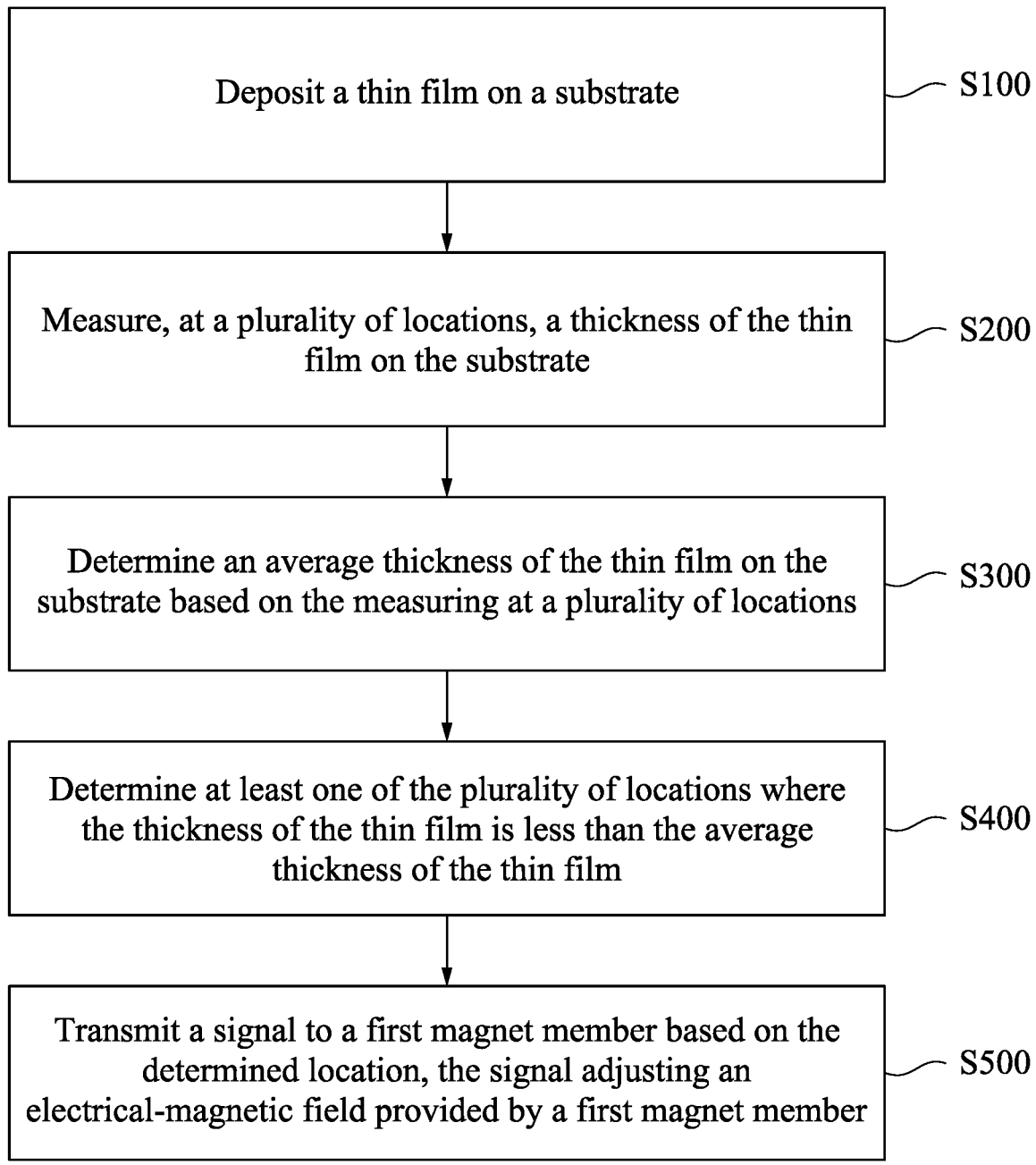
FIG. 11 is a flow chart illustrating a method of increasing uniformity of a thin film 602 on a subsequent substrate 604 according to one or more embodiments of the present disclosure.

FIG. 11 is a flow chart illustrating a method of increasing uniformity of the thin film 602 on the subsequent substrate 604 according to one or more embodiments of the present disclosure.

Referring to FIG. 11, the method of increasing uniformity of the thin film on the substrate includes: step S100 of depositing a thin film on a substrate; step S200 measuring, at a plurality of locations, a thickness of the thin film on the substrate; step S300 determining an average thickness of the thin film on the substrate based on the measuring at a plurality of locations; step S400 determining at least one of the plurality of locations where the thickness of the thin film is less than the average thickness of the thin film; and step S500 transmitting a signal to a first magnet member based on the determined location, the signal adjusting an magnetic field (electromagnetic field) provided by a first magnet member.

The step S100 of depositing the thin film on the substrate is a step of depositing the thin film 502 on the initial substrate 504. As discussed above, during the sputtering, the positively charged argon ions bombard the target 204 and the momentum of the positively charged argon ion transfers to the target material to dislodge one or more atoms which eventually land on (deposit on) the initial substrate 504.

The step S200 of measuring, at the plurality of locations, the thickness of the thin film on the substrate is a step of measuring the thickness of the thin film 502 at several locations using the metrology tool. The metrology tool transmits the measurement data to the controller 300 of the deposition system 100 directly or indirectly.

The step S300 of determining the average thickness of the thin film on the substrate based on the measuring at the plurality of locations is a step of determining the average thickness of the thin film 502 based on the measurement data received. As discussed above, the input circuitry 302 of the controller 300 receives the measurement data from the metrology tool. Processor 306 of the controller 300 determines the average thickness based on the measurement data. In alternative embodiments, the metrology tool includes a processer which determines the average thickness based on the measurement data and transmits the determined average thickness to the controller 300.

The step S400 of determining at least one of the plurality of locations where the thickness of the thin film is less than the average thickness of the thin film is a step of determining at least one location on the initial substrate 504 where the thickness of the thin film 502 is less than the determined average thickness of the thin film 502. As discussed above, the processor 306 of the controller 300 determines at least one location on the initial substrate 504 where the thickness of the thin film 502 is less than the determined average thickness of the thin film 502. In alternative embodiments, the metrology tool includes a processer which determines the at least one location on the initial substrate 504 where the thickness of the thin film 502 is less than the determined average thickness of the thin film 502.

The step S500 is a step of transmitting the signal to the first magnet member based on the determined location, the signal adjusting a magnetic field (electromagnetic field) provided by a first magnet member. As discussed above, the controller 300 transmits the tilt (and/or rotate) signal to corresponding magnet members 402, 404 to increase the magnitude of the magnetic field at the determined locations which results in an increase in ion bombardment on the determined locations. In some embodiments in accordance with the present disclosure, the controller 300 supplies more current to the corresponding magnet members 404 to increase magnitude of the magnetic field and thereby the ion bombardment on the determined locations. In some embodiments in accordance with the present disclosure, the controller 300 supplies no or less current to non-corresponding magnet members 404. Controller 300 may control the magnet members 402, 404 using any of the combinations of methods described above.

Figure 12:
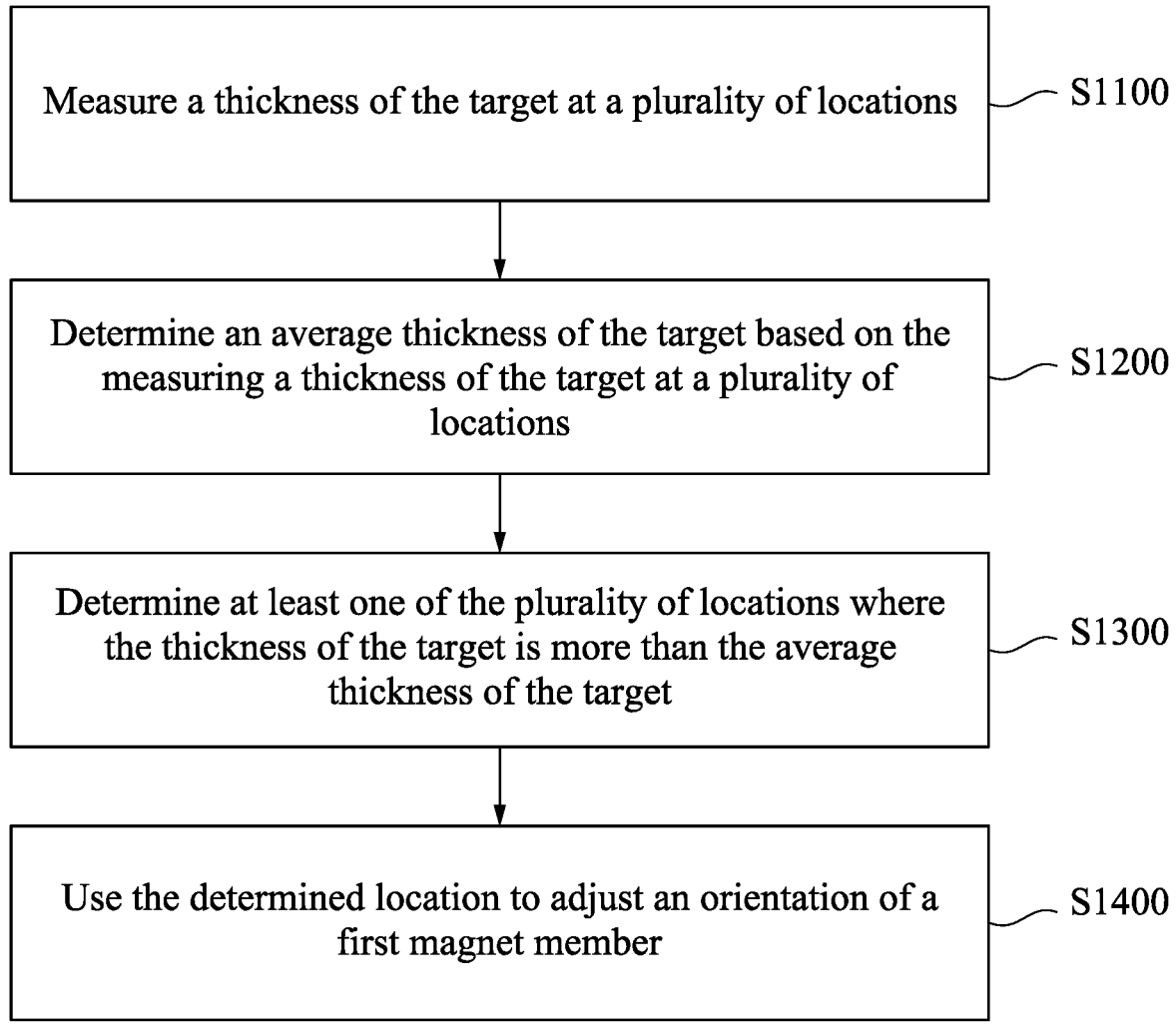
FIG. 12 is a flow chart illustrating a method of increasing a target change interval according to one or more embodiments of the present disclosure.

FIG. 12 is a flow chart illustrating a method of increasing the target change interval according to one or more embodiments of the present disclosure.

Referring to FIG. 12, the method of increasing target change interval includes: step S1100 of measuring a thickness of the target at a plurality of locations; step S1200 of determining an average thickness of the target based on the measuring a thickness of the target at a plurality of locations; step S1300 of determining at least one of the plurality of locations where the thickness of the target is more than the average thickness of the target; and step S1400 of using the determined location to adjust an orientation of a first magnet member.

Step S1100 of measuring the thickness of the target at the plurality of locations is a step of measuring the thickness at the plurality of locations on the surface of the target. As discussed above, one or more ultrasonic sensors 208 are located above the target 204. Each of the ultrasonic sensors 208 measures the thickness of the target 204 in a respective area using non-destructive testing techniques based on the propagation of ultrasonic waves. In accordance with one or more embodiments, the controller 300 receives the thickness measurements or signals representative of the thickness of the target at a plurality of locations from each of the ultrasonic sensors 208.

Step S1200 of determining the average thickness of the target based on measuring a thickness of the target at a plurality of locations is a step of determining the average thickness of the target 204. In some embodiments, the input circuitry 302 of the controller 300 receives the measurement data from the ultrasonic sensors 208. Based on the measurement data, the processor 306 of the controller 300 determines the average thickness of the target 204. In the next step, the average thickness of the target 204 is used as a threshold to determine the locations where the thickness of the target is more than the average thickness of the target 204. In some embodiments, the threshold can be also be set by the operator. In accordance with some embodiments of the present disclosure, the threshold can be set with a predetermined value based on the usage of the target 204. For example, in some embodiments of the present disclosure, the predetermined value for the threshold decreases as the usage of the target 204 increases.

Step S1300 of determining at least one of the plurality of locations where the thickness of the target is more than the average thickness of the target is a step of determining one or more locations on the target 204 where the more magnetic field should be focused. Processor 306 of the controller 300 determines one or more locations on the target 204 where the thickness of the target 204 is more than the determined average thickness of the target 204. As discussed above, in some embodiments of the present disclosure, the average can be a predetermined value which is subject to change based on the target usage.

Step S1400 of using the determined location to adjust the orientation of a first magnet member is a step of adjusting the magnetic field generated by the array of the magnet member 206. As discussed above, the controller 300 transmits the tilt (and/or rotate) signal to corresponding magnet members 402, 404 to adjust the magnetic field around the determined location to either increase or decrease the ion bombardment on the determined locations. In some embodiments in accordance with the present disclosure, the controller 300 supplies more current to the corresponding magnet members 404 to increase the ion bombardment on the determined locations. In some embodiments in accordance with the present disclosure, the controller 300 supplies no or less current to non-corresponding magnet members 404. Controller 300 may control the magnet members 402, 404 using any of the combinations of methods described above.

Utilizing the tiltable and/or rotatable magnet members 402, 404 will produce a substantial cost savings by extending the interval between the target replacements. For example, the targets 204 with sufficient material remaining are often discarded prematurely due to uneven erosion or consumption of the target material. However, by redirecting the magnetic field direction in accordance with some embodiments described herein, the erosion of material on the target 204 is more even and more material on the target 204 is utilized.

Utilizing the controller 300 which is capable of controlling the uniformity of the thin film on the subsequent substrate 604 based on the determined average thickness of the thin film provides the operator a less invasive method of increasing the uniformity of the thin film. In other words, the controller 300 can provide thin film uniformity improvement without affecting the overall process result.

According to one or more embodiments of the present disclosure, a method of increasing uniformity of the thin film on the substrate includes depositing a thin film on a substrate. The thin film is deposited on the substrate using the sputtering process. The method includes measuring, at a plurality of locations, a thickness of the thin film on the substrate. The measurement can be done using a metrology tool. However, if the deposition tool is equipped with the metrology system, the measurement can be done within the deposition system. The method includes determining an average thickness of the thin film on the substrate based on the measuring at a plurality of locations. The controller determines the average thickness of the thin film on the substrate based on the measurement data from the metrology tool. The method includes determining at least one of the plurality of locations where the thickness of the thin film is less than the average thickness of the thin film. The controller determines one or more locations where more target material should be deposited based on the average thickness. The method includes transmitting a signal to a first magnet member based on the determined location, the signal adjusting a magnetic field (electromagnetic field) provided by a first magnet member.

According to one or more embodiments of the present disclosure, a method of increasing target change interval includes measuring a thickness of the target at a plurality of locations. One or more ultrasonic sensors can be used to measure the thickness of the target. The method includes determining an average thickness of the target based on measuring the thickness of the target at a plurality of locations. For example, the input circuitry of the controller receives the measurement data from the sensors and the processor of the controller determines the average thickness of the target. The method includes determining at least one of the plurality of locations where the thickness of the target is more than the average thickness of the target. Based on the determined average, the processor determines one or more locations where the thickness of the target is more than the average thickness of the target. The method includes using the determined location to adjust the orientation of a first magnet member.

According to one or more embodiments of the present disclosure, a deposition system is provided capable of providing a longer target change interval and more uniform deposition. Deposition systems in accordance with the present disclosure include a substrate process chamber. Deposition systems in accordance with the present disclosure include a substrate chuck in the substrate process chamber and a target enclosing the substrate process chamber. An array of magnet members above the target is provided. A plurality of magnet members in the array of magnet members can be tilted collectively or individually.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of depositing a material from a target onto a subsequent substrate in a physical vapor deposition (PVD) chamber, comprising:
   measuring, at a plurality of locations, a thickness of a film on an initial substrate;
   determining at least one location of the plurality of locations where the thickness of the film is less than or greater than an average thickness of the film on the initial substrate; and
   moving a first magnet member to redirect and apply a magnetic field to the target in a different orientation than when forming the film on the initial substrate based on the at least one location of the plurality of locations where the thickness of the film is less than or greater than the average thickness of the film formed on the initial substrate, the moving the first magnet member including at least one of the following of:
      activating one or more actuators of the first magnet member tilting the first magnet member in a tilt direction about a first line parallel with a surface of the target facing towards the subsequent substrate by changing a slope between the first magnet member and the first line that is parallel to the surface of the target;
      activating a drive mechanism of the first magnet member rotating the first magnet member in a rotation direction about a second line perpendicular to the surface of the target; and
      activating both the one or more actuators and the drive mechanism of the first magnet member tilting the first magnet member in the tilt direction and rotating the first magnet member in the rotation direction.

2. The method of claim 1, further comprising depositing a film of material on the initial substrate.

3. The method of claim 1, further comprising determining an average thickness of the film on the initial substrate based on the measuring at the plurality of locations.

4. The method of claim 1, further comprising transmitting a signal to a first magnet member based on the determined at least one location of the plurality of locations.

5. The method of claim 4, wherein the signal transmitted to the first magnet member adjusts the magnetic field provided by the first magnet member.

6. The method of claim 1, wherein the first magnet member is at least one of the following of a permanent magnet and an electromagnet.

7. The method of claim 1, wherein the measuring, at the plurality of locations, the thickness of the film on the initial substrate further includes measuring the thickness of the film at the plurality of locations with one or more ultrasonic sensors.

8. The method of claim 7, wherein measuring the thickness of the film at the plurality of locations with the one or more ultrasonic sensors further includes moving the one or more ultrasonic sensors.

9. A method of depositing a material from a target onto a subsequent substrate in a physical vapor deposition (PVD) chamber, comprising:
   depositing a film of the material on an initial substrate;
   measuring, at a plurality of locations, a thickness of the film on the initial substrate;
   determining an average thickness of the film on the initial substrate based on the measuring at a plurality of locations;
   determining at least one location of the plurality of locations where the thickness of the film is less than the average thickness of the film;
   transmitting a signal to a first magnet member based on the determined at least one location, the signal adjusting a magnetic field provided by the first magnet member; and moving the first magnet member to apply the magnetic field to an area on the target which is located directly over the determined at least one location, the moving the first magnet member including activating one or more actuators of the first magnet member tilting the first magnet member in a tilt direction about a first line parallel with a surface of the target previously facing towards the initial substrate and activating a drive mechanism of the first magnet member rotating the first magnet member in a rotation direction about a second line perpendicular to the surface of the target.

10. The method of claim 9, wherein the first magnet member is at least one of the following of a permanent magnet and an electromagnet.

11. The method of claim 9, wherein the measuring, at the plurality of locations, the thickness of the film on the initial substrate further includes measuring the thickness of the film at the plurality of locations with one or more ultrasonic sensors.

12. The method of claim 11, wherein measuring the thickness of the film at the plurality of locations with the one or more ultrasonic sensors further includes moving the one or more ultrasonic sensors.

13. A method of depositing a material from a target onto a subsequent substrate in a physical vapor deposition (PVD) chamber, comprising:
measuring at a plurality of locations along an initial substrate, a thickness of a first film on the initial substrate;
determining at least one location of the plurality of locations where the thickness of the first film is less than or greater than an average thickness of the first film on the initial substrate; and
adjusting a magnetic field of a first magnet member to redirect and apply to a target in a different orientation than when forming the first film on the initial substrate based on the at least one location of the plurality of locations where the thickness of the first film is less than or greater than the average thickness of the first film formed on the initial substrate.

14. The method of claim 13, wherein adjusting the magnetic field of the first magnet member includes at least one of the following of:
rotating the first magnet member to redirect the magnetic field of the first magnet member;
tilting the first magnet member to redirect the magnetic field of the first magnet member; and
adjusting a signal provided to the first magnet member to adjust a magnitude of the magnetic field of the first magnet member.

15. The method of claim 13, wherein the first magnet member is tiltable and rotatable about one or more axes transverse to a surface of the target.

16. The method of claim 13, wherein measuring at the plurality of locations along the initial substrate, the thickness of the first film previously deposited onto the initial substrate includes measuring the thickness with one or more sensors.

17. The method of claim 16, wherein measuring the thickness with the one or more sensors includes moving the one or more sensors.

18. The method of claim 16, wherein the one or more sensors are ultrasonic sensors.

19. The method of claim 13, further comprising depositing the first film of material on the initial substrate.

20. The method of claim 13, further comprising, after adjusting the magnetic field of the first magnet member, depositing a second film on a subsequent substrate having a thickness more uniform in thickness relative to the first film on the initial substrate.

* * * * *